(12) United States Patent
Shoda et al.

(10) Patent No.: US 12,022,641 B2
(45) Date of Patent: Jun. 25, 2024

(54) ELECTROMAGNETIC WAVE SUPPRESSION SHEET AND METHOD OF MANUFACTURING SAME

(71) Applicant: MAXELL, LTD., Kyoto (JP)

(72) Inventors: Ryo Shoda, Tokyo (JP); Masayuki Toyoda, Kyoto (JP)

(73) Assignee: MAXELL, LTD., Kyoto (JP)

( * ) Notice: Subject to any disclaimer, the term of this patent is extended or adjusted under 35 U.S.C. 154(b) by 243 days.

(21) Appl. No.: 17/442,505

(22) PCT Filed: Mar. 26, 2020

(86) PCT No.: PCT/JP2020/013831
§ 371 (c)(1),
(2) Date: Sep. 23, 2021

(87) PCT Pub. No.: WO2020/203696
PCT Pub. Date: Oct. 8, 2020

(65) Prior Publication Data
US 2022/0159885 A1     May 19, 2022

(30) Foreign Application Priority Data
Mar. 29, 2019   (JP) ................. 2019-067134

(51) Int. Cl.
*H05K 9/00*      (2006.01)
*B32B 5/02*      (2006.01)
(Continued)

(52) U.S. Cl.
CPC ........... *H05K 9/0086* (2013.01); *B32B 5/024* (2013.01); *B32B 7/12* (2013.01); *B32B 27/12* (2013.01);
(Continued)

(58) Field of Classification Search
CPC ................................... H05K 9/0094
See application file for complete search history.

(56) References Cited

U.S. PATENT DOCUMENTS 6,674,492 B1 *   1/2004   Kogame .................. H04N 5/65
                                                   348/E5.131

FOREIGN PATENT DOCUMENTS

JP   2002-050892 A   2/2002
JP   2004-207600 A   7/2004
(Continued)

OTHER PUBLICATIONS

International Search Report (Form PCT/ISA/210); dated Jun. 16, 2020 in corresponding PCT Application No. PCT/JP2020/013831; (3 pages) (2 pages English Translation).
(Continued)

*Primary Examiner* — Hung V Ngo
(74) *Attorney, Agent, or Firm* — STAAS & HALSEY LLP

(57) ABSTRACT

An electromagnetic wave suppression sheet includes an electromagnetic wave transmitting layer having conductivity and transparency; a suppression layer having transparency; a conductive mesh having openings formed by woven lines; and an adhesive layer having transparency in this order from an outer side toward an inner side. The openings of the conductive mesh have a region in which the suppression layer and the adhesive layer are in contact with each other. A method of manufacturing an electromagnetic wave suppression sheet includes steps of preparing a laminate including the suppression layer, and the conductive mesh disposed to be in contact with the suppression layer; and applying a pressure to the conductive mesh in a direction of the suppression layer.

10 Claims, 6 Drawing Sheets

(51) Int. Cl.
  *B32B 7/12* (2006.01)
  *B32B 27/12* (2006.01)
  *B32B 27/36* (2006.01)

(52) U.S. Cl.
  CPC .......... *B32B 27/36* (2013.01); *B32B 2255/10* (2013.01); *B32B 2255/20* (2013.01); *B32B 2307/202* (2013.01); *B32B 2307/412* (2013.01); *B32B 2307/7244* (2013.01); *B32B 2307/7246* (2013.01)

(56) References Cited

FOREIGN PATENT DOCUMENTS

| JP | 2004-333746 A | 11/2004 |
|----|---------------|---------|
| JP | 2010-003964 A | 1/2010 |
| JP | 2010-153542 A | 7/2010 |
| JP | 2017-112253 A | 6/2017 |
| JP | 2017-216337 A | 12/2017 |
| WO | WO 2018/163584 A1 | 9/2018 |
| WO | WO 2019/054378 A1 | 3/2019 |

OTHER PUBLICATIONS

Written Opinion (Form PCT/ISA/237); dated Jun. 16, 2020 in corresponding PCT Application No. PCT/JP2020/013831 (3 pages) (4 pages English Translation).

Notification of Transmittal of Copies of Translation of International Preliminary Report on Patentability and International Preliminary Report on Patentability (Form PCT/IB/338; Form PCT/IB/373); dated Sep. 28, 2021 in corresponding PCT Application No. PCT/JP2020/013831 (2 pages).

Office Action dated Mar. 7, 2023 in corresponding Japanese Patent Application No. 2019-067134 (4 pages).

Extended European Search Report dated Nov. 18, 2022 in related European Patent Application No. 207835158 (7 pages).

* cited by examiner (a)

(b)

(a) 
(b) 
(c) 
(d)

ELECTROMAGNETIC WAVE SUPPRESSION SHEET AND METHOD OF MANUFACTURING SAME

CROSS REFERENCE TO RELATED APPLICATIONS

This application is a U.S. National Stage Application under 35 U.S.C. § 371 of PCT International Patent Application No. PCT/JP2020/013831, filed on Mar. 26, 2020, which claims the foreign priority benefit under 35 U.S.C. § 119 of Japanese Patent Application No. 2019-067134, filed on Mar. 29, 2019, in the Japanese Patent Office, the contents of which are incorporated by reference herein in their entirety.

TECHNICAL FIELD

The present disclosure relates to an electromagnetic wave suppression sheet and a method of manufacturing the same.

BACKGROUND ART

Electromagnetic waves generated from an electronic device may cause malfunction of another electronic device. As a technology of preventing the malfunction, for example, there is suggested an electromagnetic wave suppression sheet and a coating agent that is used in the sheet (refer to Patent Literature 1 to Patent Literature 3). Types of the electromagnetic wave suppression sheet are largely classified into a reflection type and a transmission type. The reflection type reduces electromagnetic waves by causing incident electromagnetic waves and reflected electromagnetic waves to interfere with each other. The transmission type uses a magnetic substance having a performance of absorbing electromagnetic waves and reduces the electromagnetic waves by causing the electromagnetic wave to be transmitted through a layer containing the magnetic substance.

CITATION LIST

Patent Literature

Patent Literature 1: Japanese Unexamined Patent Publication No. 2010-153542
Patent Literature 2: Japanese Unexamined Patent Publication No. 2017-112253
Patent Literature 3: Japanese Unexamined Patent Publication No. 2017-216337

SUMMARY OF INVENTION

Technical Problem

In a process of developing a reflection type electromagnetic wave suppression sheet using a mesh (hereinafter, referred to as "conductive mesh") formed from a material having conductivity, the inventors considered that potential needs exist in an electromagnetic wave suppression sheet having excellent transparency, and have proceeded development thereof. Specifically, when the electromagnetic wave suppression sheet is transparent, for example, even in a state of being laminated to a surface of an electronic device, there is an advantage that characters and the like (for example, name of a manufacturer, a model number, and a logo) which are described on the surface of the electronic device can be visually recognized. In addition, in a factory and the like where introduction of Internet of Things (IoT) is in progress, it is considered that the entirety of the factory is covered with the reflection type electromagnetic wave suppression sheet to prevent signals including a business secret from being leaked to the outside. When using an electromagnetic wave suppression sheet having excellent transparency as the sheet, solar light can be incident from a window, and electromagnetic waves can be suppressed from being leaked from the window to the outside.

An object of the present disclosure is to provide an electromagnetic wave suppression sheet having excellent transparency and a method of manufacturing the same.

Solution to Problem

According to an aspect of the present disclosure, there is provided an electromagnetic wave suppression sheet including: an electromagnetic wave transmitting layer having conductivity and transparency; a suppression layer having transparency; a conductive mesh having openings formed by horizontal lines and vertical lines; and an adhesive layer having transparency in this order from an outer side toward an inner side. The openings of the conductive mesh have a region in which the suppression layer and the adhesive layer are in contact with each other.

The electromagnetic wave suppression sheet is configured to reflect electromagnetic waves incident from an outer side (electromagnetic wave transmitting layer side) by the conductive mesh, and is classified into a reflection type. As described above, since the conductive mesh is formed by the horizontal lines and the vertical lines, the conductive mesh has a three-dimensional structure to a certain extent. Accordingly, in the case of manufacturing the electromagnetic wave suppression sheet by simply disposing the conductive mesh between the suppression layer and the adhesive layer, an air layer is interposed between the suppression layer and the adhesive layer. The inventors have prepared the electromagnetic wave suppression sheet by removing air interposed between the suppression layer and the adhesive layer as much as possible by applying a pressure to a laminate including the suppression layer, the adhesive layer, and the conductive mesh disposed between the layers in a thickness direction so as to embed the conductive mesh in the suppression layer and/or the adhesive layer. As a result, in comparison to a case where the pressure is not applied, an electromagnetic wave suppression sheet having excellent transparency was obtained. According to an evaluation test performed by the present inventors, it has been confirmed that as a joining area between the suppression layer and the adhesive layer increases (as an applied pressure increases), clarity (transparency) becomes higher (refer to FIG. 6).

The electromagnetic wave suppression sheet may not include the adhesive layer on an inner side. That is, according to another aspect of the present disclosure, there is provided an electromagnetic wave suppression sheet including: an electromagnetic wave transmitting layer having conductivity and transparency; a suppression layer having transparency; and a conductive mesh having openings formed by horizontal lines and vertical lines in this order from an outer side toward an inner side. At least a part of the conductive mesh in a thickness direction is embedded in the suppression layer. The electromagnetic wave suppression sheet of this aspect may be used as is, or may be used by providing another layer on an inner side of the suppression layer in correspondence with a use or the like.

The electromagnetic wave suppression sheet can be manufactured by a manufacturing method including the following processes. That is, according to still another aspect of the present disclosure, there is provided a method of manufacturing an electromagnetic wave suppression sheet. The method includes the steps of: preparing a laminate including the suppression layer, and the conductive mesh disposed to be in contact with the suppression layer; and applying a pressure to the conductive mesh in a direction of the suppression layer.

Advantageous Effects of Invention

According to the present disclosure, an electromagnetic wave suppression sheet having excellent transparency and a method of manufacturing the same are provided.

DESCRIPTION OF EMBODIMENTS

Figure 1:
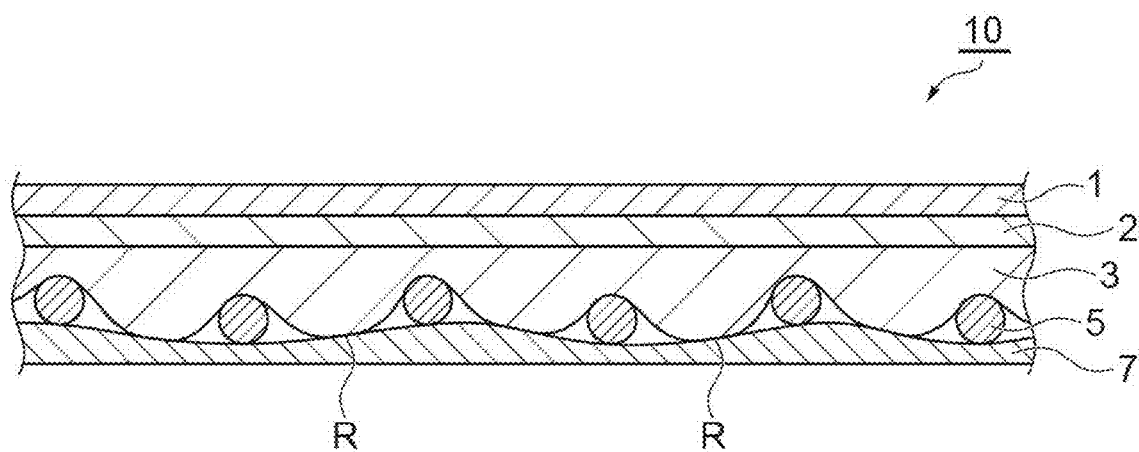
FIG. 1 is a cross-sectional view schematically illustrating an embodiment of an electromagnetic wave suppression sheet according to the present disclosure.

Hereinafter, a plurality of embodiments of the present disclosure will be described in detail with reference to the accompanying drawings. Note that, in the drawings, the same reference numeral will be given to the same or equivalent portion, and redundant description will be omitted. In addition, it is assumed that a position relationship such as upper and lower, and right and left is based on the drawings unless otherwise stated. In addition, dimension ratios of the drawings are not limited to illustrated ratios.

<Electromagnetic Wave Suppression Sheet>

An electromagnetic wave suppression sheet 10 illustrated in FIG. 1 includes a transparent gas barrier layer (surface protective layer) 1, an electromagnetic wave transmitting layer 2, a suppression layer 3, a conductive mesh 5, and an adhesive layer 7 in this order from an outer side toward an inner side. The electromagnetic wave suppression sheet 10 is configured to reflect electromagnetic waves incident from an outer side (upper side in FIG. 1) by the conductive mesh 5, and is classified into a reflection type. The electromagnetic wave suppression sheet 10 includes a region R in which the suppression layer 3 and the adhesive layer 7 are in contact with each other in an opening 5g of the conductive mesh 5. According to this, the electromagnetic wave suppression sheet 10 has excellent transparency. Specifically, haze (cloudiness) is sufficiently small, and clarity (transparency) is sufficiently high. Note that the haze (%) is a ratio of light diffused at an angle of 2.5° or greater in average with respect to light transmitted through a transparent material (sample) (total light transmittance). On the other hand, the clarity (%) is evaluated at an angle narrower than 2.5°.

The haze (cloudiness) is a value on which wide angle scattering by the transparent material reflects. As the haze value increases, contrast of an image viewed through the transparent material decreases, and a haze image is obtained. The haze of the electromagnetic wave suppression sheet 10 is preferably less than 40% from the viewpoint of the transparency, and more preferably 30% or less.

The clarity (transparency) is a value on which narrow angle scattering due to the transparent material reflects. As a value of the clarity decreases, a contour of an image viewed through the transparent material may be distorted, and thus there is a tendency that the image may not be viewed clearly. That is, the clarity has an influence on resolution of a fine characters and the like. The clarity of the electromagnetic wave suppression sheet 10 is preferably 80% or greater from the viewpoint of visibility of the fine characters and the like, and more preferably 90% or greater.

As to be described later, the electromagnetic wave suppression sheet 10 is manufactured through a process of applying a force in a direction of compressing a laminate including the suppression layer 3, the adhesive layer 7, and the conductive mesh 5 disposed between the layers. Even undergoing the process, in accordance with the degree of softness of the suppression layer 3 and the adhesive layer 7, as illustrated in FIG. 1, air remains in a region (in FIG. 1, a white blank portion) close to a wire rod of the conductive mesh 5 between the suppression layer 3 and the adhesive layer 7. In addition, since the suppression layer 3 and the adhesive layer 7 are compressed in a state in which the conductive mesh 5 is interposed therebetween, as illustrated in FIG. 1, waves occur at an interface between the suppression layer 3 and the adhesive layer 7. From the viewpoint of suppressing decrease in the transparency due to the remaining air and the waves of the interface, as materials constituting the suppression layer 3 and the adhesive layer 7, it is preferable to use materials having refractive indexes similar to each other as much as possible. That is, a difference in a refractive index between the materials is preferably 0.2 or less, and more preferably 0.1 or less. When the difference in the refractive index between the materials is set to 0.2 or less, it is possible to suppress refraction of light at the interface between the suppression layer 3 and the adhesive layer 7 to a high extent.

(Transparent Gas Barrier Layer)

The transparent gas barrier layer 1 is a layer configured to prevent intrusion of moisture and oxygen in the air to the inside of the electromagnetic wave suppression sheet 10. As to be described later, in a case where the electromagnetic wave transmitting layer 2 contains an organic material having conductivity, when the transparent gas barrier layer 1 is provided, it is possible to prevent the electromagnetic wave transmitting layer 2 from being discolored or conductivity thereof from decreasing with the passage of time due to moisture or the like in the air. For example, as illustrated in FIG. 2(a), the transparent gas barrier layer 1 is constituted by a transparent base film 1a, a vapor deposition layer 1v, and a gas barrier cover layer 1c.

It is preferable that the transparent base film 1a is sufficiently colorless and transparent. A total light transmittance of the transparent base film 1a is preferably 85% or greater. As the transparent base film 1a, for example, a polyethylene terephthalate film (PET film), a polyethylene naphthalate film, or the like can be used as a film having high transparency and excellent heat resistance. The thickness of the transparent base film 1a is 9 to 50 and preferably 12 to 30 When the thickness of the transparent base film 1a is 9 μm or greater, the strength of the transparent base film 1a can be sufficiently secured. On the other hand, when the thickness is 50 μm or less, the transparent gas barrier layer 1 in a roll shape can be manufactured efficiently and economically.

Figure 2:
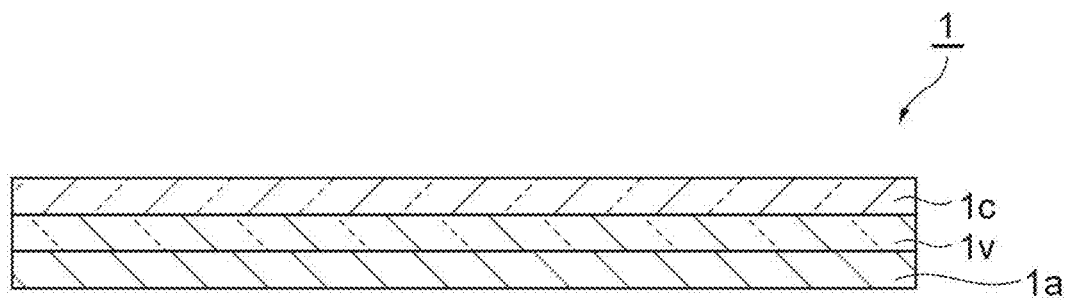
FIG. 2(a) and FIG. 2(b) are cross-sectional views schematically illustrating an aspect of a transparent gas barrier layer.
Figure 2:
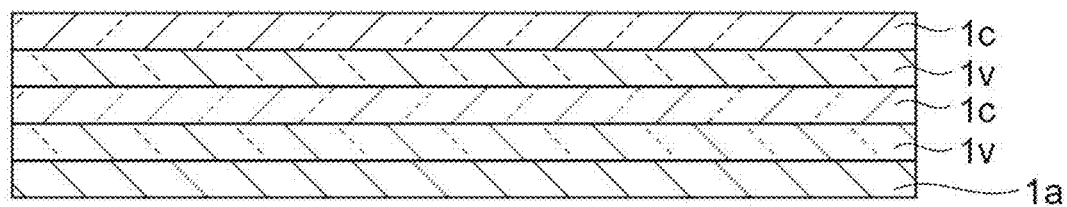

In this embodiment, the vapor deposition layer 1v is provided on one surface of the transparent base film 1a, and the gas barrier cover layer 1c is further provided on the vapor deposition layer 1v (refer to FIG. 2(a)). In order to improve adhesiveness between the transparent base film 1a and the vapor deposition layer 1v, the surface of the transparent base film 1a may be subjected to a treatment such as a plasma treatment, or an anchor coating layer (not illustrated) formed from an acrylic resin layer, a polyester resin, a urethane resin, or the like may be provided on the surface. Note that, as illustrated in FIG. 2(b), the vapor deposition layer 1v and the gas barrier cover layer 1c may be alternatively laminated.

For example, the vapor deposition layer 1v can be formed by vapor-depositing aluminum oxide, silicon oxide, silicon oxynitride, magnesium oxide, or a mixture thereof on the transparent base film 1a. Among the inorganic materials, from the viewpoint of barrier and productivity, it is preferable to use aluminum oxide or silicon oxide. The vapor deposition layer is formed by a method such as vacuum vapor deposition, sputtering, and CVD.

It is preferable that the thickness (film thickness) of the vapor deposition layer 1v is set within a range of 5 to 500 nm, and more preferably within a range of 10 to 100 nm. When the film thickness is 5 nm or greater, there is a tendency that a uniform film is likely to be formed, and a function as a gas barrier material can be more sufficiently exhibited. On the other hand, when the film thickness is 500 nm or less, there is a tendency that sufficient flexibility can be retained, and it is possible to more reliably prevent cracks from occurring in a thin film due to an external factor such as bending and pulling after film formation.

The gas barrier cover layer 1c is provided to prevent various secondary damages in subsequent processes and to apply a high barrier property. It is preferable that the gas barrier cover layer 1c contains at least one kind selected from the group consisting of a hydroxyl group-containing polymer compound, a metal alkoxide, a metal alkoxide hydrolysate, and a metal alkoxide polymer as a component from the viewpoint of obtaining an excellent barrier property.

Specific examples of the hydroxyl group-containing polymer compound include a water-soluble polymer such as polyvinyl alcohol, polyvinyl pyrrolidone, and starch. Particularly, in the case of using polyvinyl alcohol, the barrier property is excellent.

Metal alkoxide is a compound expressed by a general formula: $M(OR)_n$ (M represents a metal atom such as Si, Ti, Al, and Zr, R represents an alkyl group such as —$CH_3$ and —$C_2H_5$, and n represents an integer corresponding to a valence of M). Specific examples thereof include tetraethoxy silane [$Si(OC_2H_5)_4$], and triisopropoxy aluminum [$Al(O\text{-iso-}C_3H_7)_3$]. Tetraethoxy silane and triisopropoxy aluminum are relatively stable in an aqueous solvent after hydrolysis, and thus these materials are preferable. In addition, with regard to a hydrolysate and a polymer of the metal alkoxide, silicic acid ($Si(OH)_4$) and the like are exemplified as a hydrolysate and a polymer of tetraethoxy silane, and aluminum hydroxide ($Al(OH)_3$) and the like can be exemplified as a hydrolysate and a polymer of tripropoxy aluminum.

It is preferable that the thickness (film thickness) of the gas barrier cover layer 1c is set within a range of 50 to 1000 nm, and more preferably within a range of 100 to 500 nm. When the film thickness is 50 nm or greater, there is a tendency that a more sufficient gas barrier property can be obtained, and when the film thickness is 1000 nm or less, there is a tendency that sufficient flexibility can be retained.

In a case where the transparent gas barrier layer 1 includes the vapor deposition layer 1v and the gas barrier cover layer 1c as illustrated in FIG. 2(a) and FIG. 2(b), it is preferable that a direction of the transparent gas barrier layer 1 is a direction in which the gas barrier cover layer 1c and the electromagnetic wave transmitting layer 2 face each other. Note that, in the transparent gas barrier layer 1, the vapor deposition layer 1v may be formed on one surface of the transparent base film 1a (an aspect in which the gas barrier cover layer 1c is not formed), and in this case, it is preferable that the direction of the transparent gas barrier layer 1 is a direction in which the vapor deposition layer 1v and the electromagnetic wave transmitting layer 2 face each other. In addition, the transparent gas barrier layer 1 may be formed from the transparent base film 1a (for example, a PET film) (an aspect in which the vapor deposition layer 1v and the gas barrier cover layer 1c are not formed).

(Electromagnetic Wave Transmitting Layer)

The electromagnetic wave transmitting layer 2 is a layer configured to allow electromagnetic waves incident from an outer side to reach the suppression layer 3. That is, the electromagnetic wave transmitting layer 2 is a layer for impedance matching in correspondence with an environment in which the electromagnetic wave suppression sheet 10 is used. In a case where the electromagnetic wave suppression sheet 10 is used in the air (impedance: 377Ω/□), a sheet resistance of the electromagnetic wave transmitting layer 2 is set, for example, within a range of 310 to 500 Ω/□. This range may be 350 to 400 Ω/□.

The electromagnetic wave transmitting layer 2 includes an inorganic material or an organic material having conductivity. Examples of the inorganic material having conductivity include nanoparticles and/or nanowire containing one or more selected from the group consisting of nanoparticles of indium tin oxide (ITO), indium zinc oxide (IZO), aluminum zinc oxide (AZO), carbon nanotubes, graphene, Ag, Al, Au, Pt, Pd, Cu, Co, Cr, In, Ag—Cu, Cu—Au, and Ni, and examples of the organic material having conductivity include polythiophene derivatives, polyacetylene derivatives, polyaniline derivatives, and polypyrrole derivatives.

Particularly, a conductive polymer containing polyethylene dioxythiophene (PEDOT) is preferable from the viewpoint of flexibility, a film forming property, stability, and a sheet resistance of 377Ω/□. The electromagnetic wave transmitting layer 2 may contain a mixture (PEDOT/PSS) of polyethylene dioxythiophene (PEDOT) and polystyrene sulfonic acid (PPS).

For example, the sheet resistance value of the electromagnetic wave transmitting layer 2 can be appropriately set through selection of the organic material having conductivity, and adjustment of a film thickness. It is preferable that the thickness (film thickness) of the electromagnetic wave transmitting layer 2 is set within a range of 0.1 to 2.0 μm, and more preferably within a range of 0.1 to 0.4 μm. When the film thickness is 0.1 μm or greater, there is a tendency that a uniform film is likely to be formed, and a function as the electromagnetic wave transmitting layer 2 can be more sufficiently exhibited. On the other hand, when the film thickness is 2.0 µm or less, there is a tendency that sufficient flexibility can be retained, and it is possible to more reliably prevent cracks from occurring in a thin film due to an external factor such as bending and pulling after film formation. The sheet resistance value of the electromagnetic wave transmitting layer 2 can be measured by using, for example, Loresta-GP MCP-T610 (product name, manufactured by Mitsubishi Chemical Analytech Co., Ltd.).

(Suppression Layer)

The suppression layer 3 is a layer configured to cause incident electromagnetic waves and reflected electromagnetic waves to interfere with each other. In the suppression layer 3, thickness and the like are set to satisfy conditions expressed by the following expression.

$$d=\lambda/(4(\varepsilon_r)^{1/2})$$

In expression, $\lambda$ represents a wavelength (unit: m) of electromagnetic waves to be suppressed, $\varepsilon_r$ represents a relative permittivity of a material that constitutes the suppression layer 3, and d represents the thickness (unit: m) of the suppression layer 3.

Examples of a transparent material that constitutes the suppression layer 3 include silicone adhesive, acrylic adhesive, and urethane adhesive, and the silicone adhesive is preferably used from the viewpoint of weather resistance. For example, when using silicone adhesive having a dielectric constant of 3.0 as the material that constitutes the suppression layer 3, the thickness of the suppression layer 3 may be set in correspondence with a wavelength of electromagnetic waves to be suppressed as follows. For example, in a case where the electromagnetic waves to be suppressed are millimeter waves having a wavelength of 1 to 10 mm, the thickness of the suppression layer 3 may be set to approximately 0.144 to 1.4 mm. In a case where the electromagnetic waves to be suppressed are sub-millimeter waves (terahertz waves) having a wavelength of 100 to 1000 µm (frequency is 3.0 to 0.3 THz), the thickness of the suppression layer 3 may be set to approximately 14.4 to 144 µm. From the viewpoint that the thickness of the suppression layer 3 is set to an approximate thickness in consideration of manufacturing efficiency, a transparent material having a dielectric constant suitable for the viewpoint may be employed as the suppression layer 3.

(Conductive Mesh)

Figure 3:
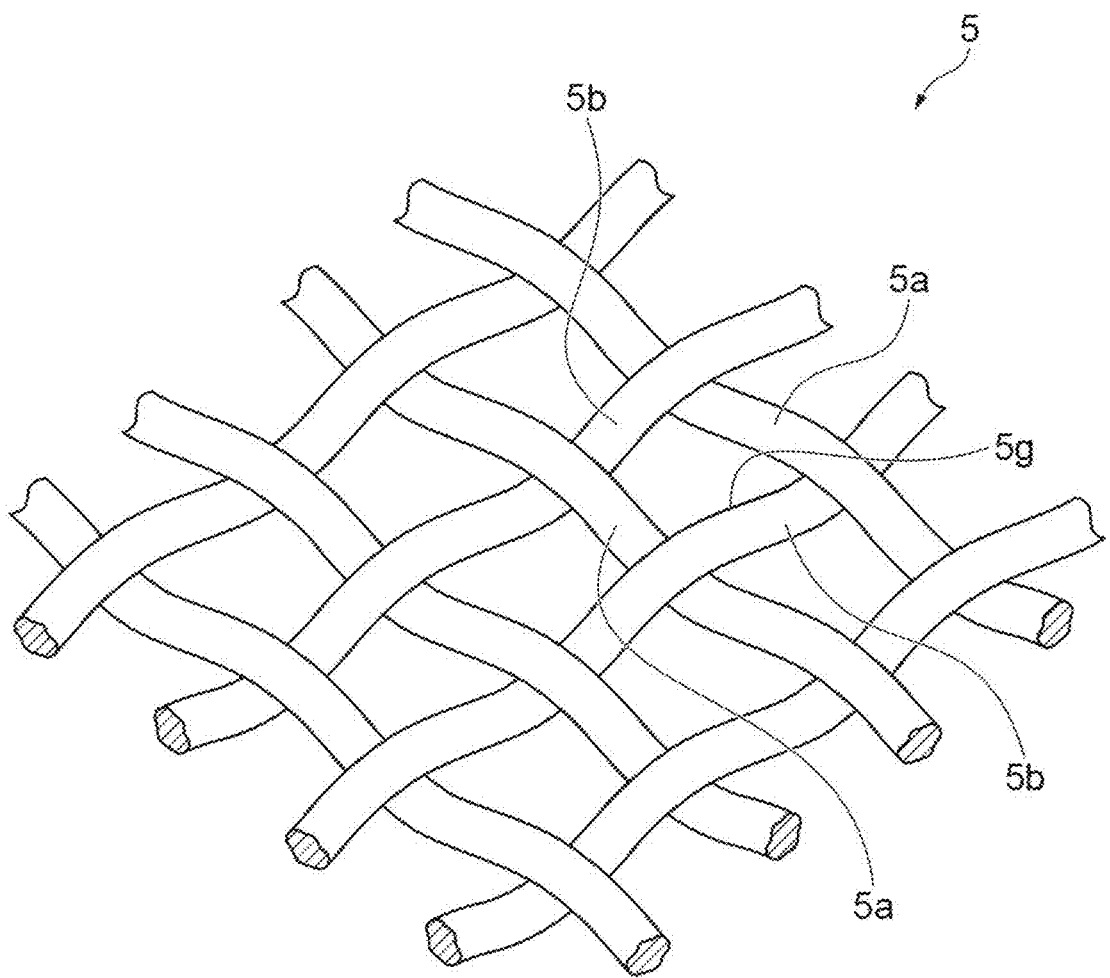
FIG. 3 is a perspective view schematically illustrating a configuration of a conductive mesh.

As illustrated in FIG. 3, the conductive mesh 5 is formed by weaving horizontal lines 5a and vertical lines 5b. The horizontal lines 5a and the vertical lines 5b may be the same as each other or different from each other. For example, the horizontal lines 5a and the vertical lines 5b are formed from copper wires having a diameter of approximately 20 to 30 µm. For example, the horizontal lines 5a and the vertical lines 5b may be constituted by a core material formed from polyethylene terephthalate (PET) and a copper layer formed to cover a surface of the core material. The copper layer may be subjected to a blackening treatment. In addition, the conductive mesh 5 may be a member in which an opening 5g is formed in a metal plate such as a copper plate by using a known method such as etching.

The conductive mesh 5 includes a plurality of the openings 5g, each being constituted by two horizontal lines 5a and 5a adjacent to each other, and two vertical lines 5b and 5b adjacent to each other. A shape of each of the openings 5g is an approximately square shape in a plan view. Note that, for example, the shape of the opening 5g may be a rectangular shape. A length of one side of the opening 5g may be set in correspondence with a wavelength of electromagnetic waves to be reflected. In a case where electromagnetic waves to be suppressed are millimeter waves having a wavelength of 1 to 10 mm, the length of one side of the opening 5g may be approximately 100 to 500 µm. In a case where electromagnetic waves to be suppressed are sub-millimeter waves having a wavelength of 100 to 1000 µm, the length of one side of the opening 5g may be approximately 25 to 300 µm.

(Adhesive Layer)

Figure 4:
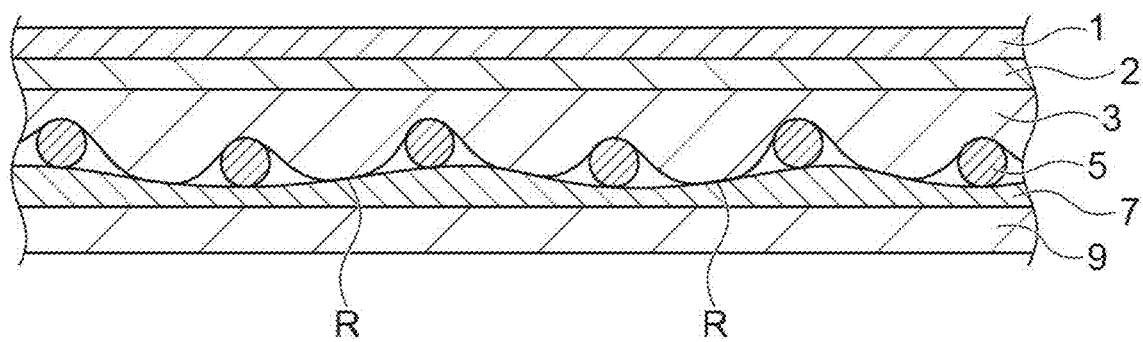
FIG. 4 is a cross-sectional view schematically illustrating an electromagnetic wave suppression sheet including a release film.

The adhesive layer 7 is a layer to stick the electromagnetic wave suppression sheet 10 to a predetermined site. The adhesive layer 7 is also a layer configured to embed the conductive mesh 5 in combination with the suppression layer 3. As described above, in the opening 5g of the conductive mesh 5, since a region R in which the suppression layer 3 and the adhesive layer 7 are in contact with each other is provided, the electromagnetic wave suppression sheet 10 exhibits excellent transparency. Examples of a transparent material that constitutes the adhesive layer 7 include silicone adhesive, acrylic adhesive, and urethane adhesive, and it is preferable that the transparent material is appropriately selected from the viewpoint of transparency, adhesiveness, or the price. From the viewpoint of transparency, it is preferable to select the same material as in the suppression layer so as to reduce a difference in a refractive index between the adhesive layer 7 and the suppression layer. From the viewpoint of adhesiveness, it is preferable to appropriately select the transparent material so as to enhance compatibility with the suppression layer, the conductive mesh, and an adherend corresponding to use. From the viewpoint of the price, acrylic adhesive is preferably selected. Note that, as illustrated in FIG. 4, a release film 9 is preferably stuck to an outer side of the adhesive layer 7 so as to prevent dust and the like from adhering to the adhesive layer 7, and so as to prevent deterioration of transparency or adhesiveness to the adherend.

On the basis of an area of the opening 5g of the conductive mesh 5, a ratio of an area of the region R in which the suppression layer 3 and the adhesive layer 7 are in contact with each other (hereinafter, referred to as "joining area ratio") is preferably 60% or greater, and more preferably 70%. When the ratio is set to 60% or greater, small haze (cloudiness) and high clarity (transparency) of the electromagnetic wave suppression sheet 10 are compatible with each other.

The electromagnetic wave suppression sheet 10 can be manufactured by a method including the following processes. That is, a method of manufacturing the electromagnetic wave suppression sheet 10 includes a process of preparing a laminate including the suppression layer 3, the adhesive layer 7, and the conductive mesh 5 disposed between the layers, and a process of applying a pressure to the laminate. The pressure may be appropriately set in correspondence with the degree of softness of the suppression layer 3 and the adhesive layer 7. For example, when applying the pressure to the laminate by causing the laminate to pass between a pair of rollers, a linear pressure applied by the pair of rollers may be set to approximately 0.5 to 7.0 N/mm (preferably, 1.0 to 5.0 N/mm).

Hereinbefore, the embodiment of the present disclosure has been described in detail, but the invention is not limited to the above-described embodiment. For example, in the above-described embodiment, description has been given of a case where the electromagnetic wave transmitting layer 2 is formed from a conductive polymer (organic material), but an inorganic material such as indium tin oxide (ITO) may be employed instead of the conductive polymer.

In the above-described embodiment, description has been given of a case where the transparent gas barrier layer 1 is formed as a surface protective layer. Alternatively, for example, a high-hardness layer may be formed on an outer side of the transparent gas barrier layer 1 to physically protect a surface of the electromagnetic wave suppression sheet 10.

In the above-described embodiment, description has been given of an aspect in which the adhesive layer 7 is formed on an inner side. However, for example, in a case where a target to which the electromagnetic wave suppression sheet is stuck has stickiness, and the like, the adhesive layer 7 may not be formed in the electromagnetic wave suppression sheet. The electromagnetic wave suppression sheet in this aspect can be manufactured by a process of preparing a laminate including the suppression layer 3 and the conductive mesh 5 disposed to be in contact with the suppression layer 3, and a process of applying a pressure to the conductive mesh 5 in a direction of the suppression layer 3.

<Evaluation of Transparency>

An influence by the joining area ratio on transparency (haze, clarity, and image clarity) of the electromagnetic wave suppression sheet was evaluated by the following method. That is, a base film (a PET film having a width of 340 mm) pulled out from a roll was installed in a laminating device. A laminate in which an adhesive layer, a conductive mesh, a suppression layer, and a PET film were laminated in this order on a surface of the base film was formed.

Adhesive layer . . . MHM-FWV100 (product name, manufactured by Nichiei Kako Co., Ltd.), size: 330 mm×330 mm, material: acrylic optically clear adhesive (OCA), and thickness: 100 μm Conductive mesh . . . Su-4G-13227 (product name, manufactured by SEIREN CO., LTD.), size: 340 mm×340 mm, linear diameter: 58 μm, and opening shape: square (0.2 mm×0.2 mm)

Suppression layer . . . MHM-SI500 (product name, manufactured by Nichiei Kako Co., Ltd.), size: 310 mm×310 mm, material: silicone-based optically clear adhesive (OCA), and thickness: 500 μm PET film . . . manufactured by TORAY INDUSTRIES, INC., size: 340 mm×340 mm, and thickness: 75 μm (Experiment 1)

A pressure (linear pressure: 0.7 N/mm) was applied to the laminate by using a pair of rollers (a metal roller and a rubber roller) to embed at least a part of the conductive mesh in the suppression layer and the adhesive layer, thereby obtaining a joining part of the adhesive layer and the suppression layer in an opening of the conductive mesh. A speed (line speed) of the laminate passing through the pair of rollers was set to 1.0 m/minute.

(Experiment 2)

At least a part of the conductive mesh was embedded in the suppression layer and the adhesive layer to obtain a joining part of the adhesive layer and the suppression layer in the opening of the conductive mesh in a similar manner as in Experiment 1 except that the linear pressure was set to 2.2 N/mm instead of 0.7 N/mm.

(Experiment 3)

At least a part of the conductive mesh was embedded in the suppression layer and the adhesive layer to obtain a joining part of the adhesive layer and the suppression layer in the opening of the conductive mesh in a similar manner as in Experiment 1 except that the linear pressure was set to 4.3 N/mm instead of 0.7 N/mm.

(Comparative Experiment 1)

Although the laminate was caused to pass between the pair of rollers, a pressure was not applied.

(1) Measurement of Joining Area Ratio

Figure 5:
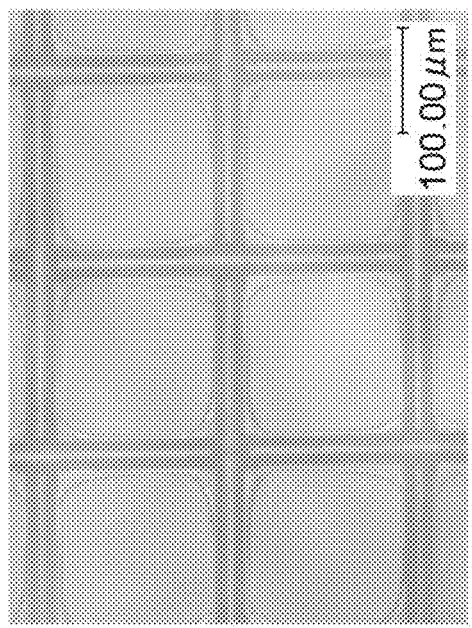
FIG. 5(a) is a photomicrograph of a laminate according to Experiment 1.
FIG. 5(b) is a photomicrograph of a laminate according to Experiment 2.
FIG. 5(c) is a photomicrograph of a laminate according to Experiment 3.
FIG. 5(d) is a photomicrograph of a laminate according to Comparative Experiment 1.
Figure 5:
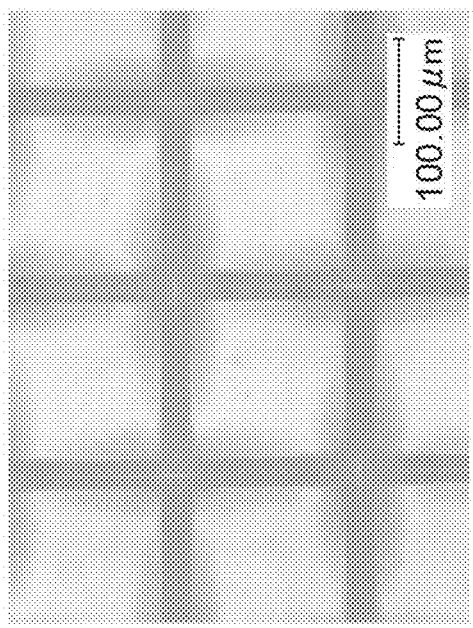
Figure 5:
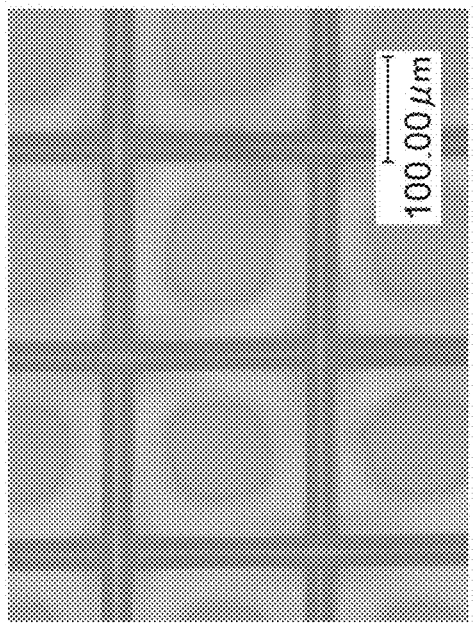
Figure 5:
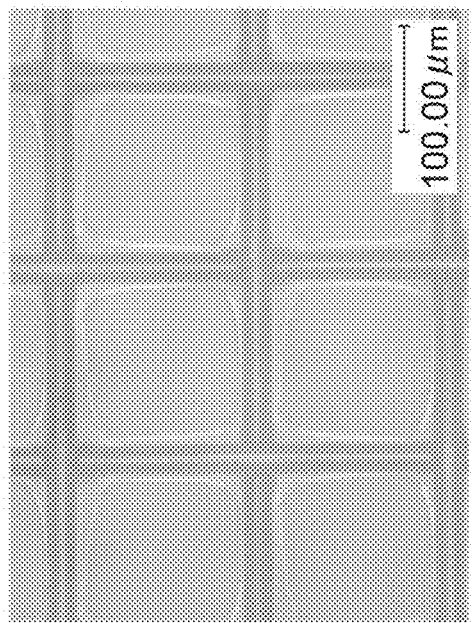

The laminate according to each of Experiment 1 to Experiment 3, and Comparative Experiment 1 was observed on the base film side to obtain a joining area, and a joining area ratio was calculated by using the value of the joining area. FIG. 5(*a*) to FIG. 5(*d*) are photomicrographs of laminates according to Experiment 1 to Experiment 3, and Comparative Experiment 1. In the photomicrographs, a region R surrounded by a broken line is a region in which the suppression layer and the adhesive layer are in contact with each other.

Results are shown in Table 1.

(2) Measurement of Haze and Clarity

Figure 6:
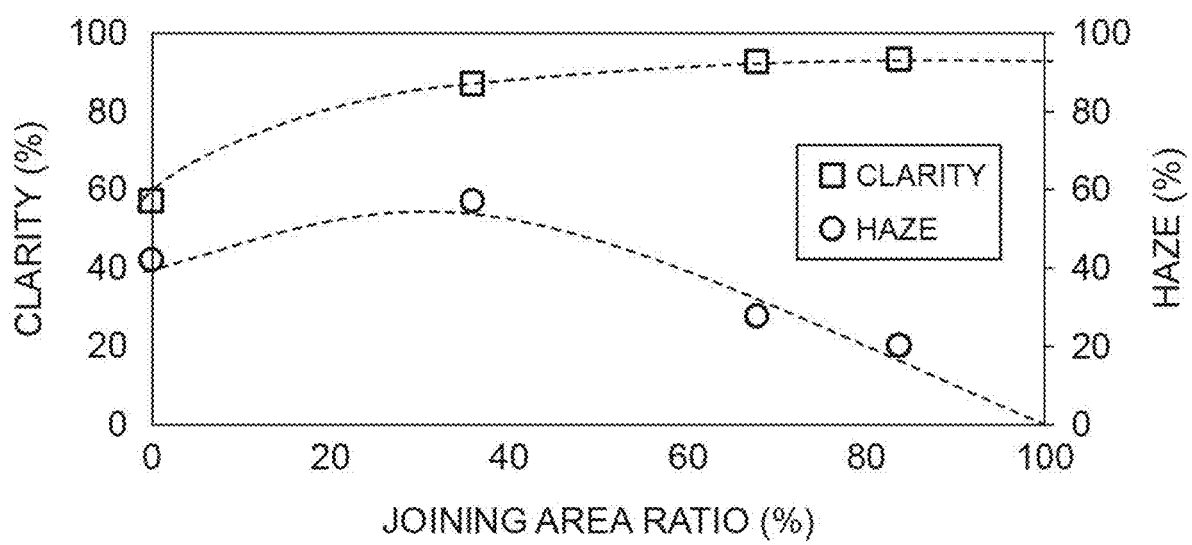
FIG. 6 is a graph showing a relationship between a joining area ratio, and clarity and haze of the electromagnetic wave suppression sheet.

Haze and clarity of the laminates according to Experiment 1 to Experiment 3, and Comparative Experiment 1 were measured by using Haze-gard Plus (manufactured by BYK). Results are shown in Table 1. FIG. 6 is a graph showing a relationship between a joining area ratio, and haze and clarity of the electromagnetic wave suppression sheet.

(Experiment 4)

A laminate in which at least a part of the conductive mesh was embedded in the suppression layer and the adhesive layer was prepared in a similar manner as in Experiment 2. The image clarity of the laminates according to Experiment 4 and Comparative Experiment 1 was evaluated by using an image clarity measuring device (manufactured by Suga Test Instruments Co., Ltd.). Note that, measurement of the image clarity is performed by using a plurality of optical combs different in a width. The image clarity is a parameter correlated with clarity, and is a parameter indicating that as a value of the image clarity is higher, resolution of characters or the like is higher. Results are shown in Table 2. Note that, a measured value of a total light transmittance of the laminate according to Experiment 4 and Comparative Experiment 1 are also described in Table 2.

TABLE 1

|  | Experiment 1 | Experiment 2 | Experiment 3 | Comparative Experiment 1 |
|---|---|---|---|---|
| Linear pressure (N/mm) | 0.7 | 2.2 | 4.3 | — |
| Joining area ratio (%) | 36 | 68 | 84 | 0 |
| Haze (%) | 57.0 | 27.2 | 20.0 | 41.5 |
| Clarity (%) | 86.6 | 92.6 | 92.8 | 56.9 |

TABLE 2

|  |  | Experiment 4 | Comparative Experiment 1 |
|---|---|---|---|
| Linear pressure (N/mm) | | 0.7 | — |
| Joining area ratio (%) | | 36 | 0 |
| Total light transmittance (%) | | 54.6 | 56.6 |
| Image clarity (C %) | Comb width 0.125 mm | 38.2 | 6.5 |
| | 0.250 mm | 46.3 | 13.4 |
| | 0.500 mm | 52.4 | 8.9 |
| | 1.000 mm | 75.9 | 19.3 |
| | 1.500 mm | 84.5 | 40.9 |
| | 2.000 mm | 88.5 | 52.7 |

INDUSTRIAL APPLICABILITY

According to the present disclosure, an electromagnetic wave suppression sheet having excellent transparency, and a method of manufacturing the same are provided.

REFERENCE SIGNS LIST

1: transparent gas barrier layer (surface protective layer), 1a: transparent base film, 1c: gas barrier cover layer, 1v: vapor deposition layer, 2: electromagnetic wave transmitting layer, 3: suppression layer, 5: conductive mesh, 5a: horizontal line, 5b: vertical line, 5g: opening, 7: adhesive layer, 10: electromagnetic wave suppression sheet, R: region.

The invention claimed is:

1. An electromagnetic wave suppression sheet comprising:
    an electromagnetic wave transmitting layer having conductivity and transparency;
    a suppression layer having transparency;
    a conductive mesh having openings formed by woven lines; and
    an adhesive layer having transparency in this order from an outer side toward an inner side,
    wherein the openings have a region in which the suppression layer and the adhesive layer are in contact with each other.

2. The electromagnetic wave suppression sheet according to claim 1, wherein the electromagnetic wave transmitting layer is formed from an organic material having conductivity.

3. The electromagnetic wave suppression sheet according to claim 2, wherein the organic material having conductivity contains polyethylene dioxythiophene.

4. The electromagnetic wave suppression sheet according to claim 1, wherein a sheet resistance value of the electromagnetic wave transmitting layer is 310 to 500 Ω/□.

5. The electromagnetic wave suppression sheet according to claim 1, further comprising a surface protective layer having transparency on an outer side of the electromagnetic wave transmitting layer.

6. The electromagnetic wave suppression sheet according to claim 5, wherein the surface protective layer has a gas barrier property.

7. The electromagnetic wave suppression sheet according to claim 1, wherein millimeter waves having a wavelength of 1 to 10 mm are suppressed.

8. The electromagnetic wave suppression sheet according to claim 1, wherein sub-millimeter waves having a wavelength of 100 to 1000 μm are suppressed.

9. The electromagnetic wave suppression sheet according to claim 1, wherein clarity is 80% or greater.

10. The electromagnetic wave suppression sheet according to claim 1, wherein haze is less than 40%.

* * * * *